(12) United States Patent
Huang

(10) Patent No.: US 8,120,421 B2
(45) Date of Patent: Feb. 21, 2012

(54) CIRCUIT STRUCTURE FREE FROM TEST EFFECT AND TESTING METHOD THEREOF

(75) Inventor: Ju-Lin Huang, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 174 days.

(21) Appl. No.: 12/604,375

(22) Filed: Oct. 22, 2009

(65) Prior Publication Data

US 2011/0043216 A1 Feb. 24, 2011

(30) Foreign Application Priority Data

Aug. 20, 2009 (TW) .............................. 98128057 A

(51) Int. Cl.
*G01R 19/00* (2006.01)
(52) U.S. Cl. ............................... 330/2; 330/51; 330/253
(58) Field of Classification Search ................ 330/2, 51, 330/253
See application file for complete search history.

(56) References Cited

U.S. PATENT DOCUMENTS

| | | | | |
|---|---|---|---|---|
| 4,939,516 A * | 7/1990 | Early | ............................. | 341/143 |
| 5,565,813 A * | 10/1996 | Connell et al. | .................... | 330/9 |
| 7,109,795 B2 * | 9/2006 | van Zeijl | ........................ | 330/254 |
| 7,116,161 B2 * | 10/2006 | Nakahira | .......................... | 330/9 |
| 7,358,809 B2 * | 4/2008 | Elder | ............................ | 330/253 |
| 7,408,402 B2 * | 8/2008 | Nishimura | ........................ | 330/9 |
| 7,443,234 B2 * | 10/2008 | Iriguchi | ........................... | 330/9 |
| 2010/0182301 A1 * | 7/2010 | Yasuda | .......................... | 345/211 |

* cited by examiner

*Primary Examiner* — Patricia Nguyen
(74) *Attorney, Agent, or Firm* — Jianq Chyun IP Office

(57) ABSTRACT

A circuit structure free from test effect is provided. The circuit structure includes a first test terminal and a second test terminal. A symmetric circuit unit is coupled between the first test terminal and the second test terminal. The symmetric circuit unit includes a plurality of transistors, wherein the transistors are symmetrically disposed to form a first part circuit and a second part circuit. A switch control unit alternatively connects the transistors of the first part circuit and the transistors of the second part circuit between the first test terminal and the second test terminal according to a control signal.

16 Claims, 6 Drawing Sheets

CIRCUIT STRUCTURE FREE FROM TEST EFFECT AND TESTING METHOD THEREOF

CROSS-REFERENCE TO RELATED APPLICATION

This application claims the priority benefit of Taiwan application serial no. 98128057, filed Aug. 20, 2009. The entirety of the above-mentioned patent application is hereby incorporated by reference herein and made a part of specification.

BACKGROUND OF THE INVENTION

1. Field of the Invention

The present invention generally relates to a technique for testing a symmetric circuit, and more particularly, to a technique for preventing transistor characteristic changes caused by circuit testing from affecting the substantial circuit characteristic.

2. Description of Related Art

After a reliability test is performed on an operation amplifier having a symmetric circuit structure, devices in the operation amplifier may have different attenuations due to different electrical characteristics or layout surroundings of these devices. As a result, the operation amplifier may produce a wrong result, such as a mismatch problem.

FIG. 1 is a diagram of an amplifier circuit in a conventional operation amplifier. FIG. 1(a) illustrates a symmetric circuit 100, and FIG. 1(b) illustrates the operation of the operation amplifier. Referring to FIG. 1(a), the symmetric circuit 100 includes four symmetrically disposed MOS transistors M1~M4. One end of a current source 102 is connected between the transistors M1 and M2, and the other end thereof is connected to a ground voltage. The gate of the transistor M1 is connected to an input terminal VI, and the gate of the transistor M2 is connected to an output terminal VO. The transistors M1 and M2 form a pair of transistors. Besides, the transistors M3 and M4 also form a pair of transistors. However, the transistor M1 is connected with the transistor M3 in series to form a part of the circuit, and the transistor M2 is connected with the transistor M4 in series to form another part of the circuit. The transistors M1 and M3 are substantially symmetrical to the transistors M2 and M4 except the slightly different connection control of the gates thereof. Referring to FIG. 1(b), the operation amplifier actually plays its part when resistors R1 and R2 are externally connected to the operation amplifier.

The attenuations of the transistors M1 and M3 and the transistors M2 and M4 may be different after a reliability test is performed on the conventional operation amplifier due to different transient electrical characteristics of the input signal VI and the output signal VO. Thus, attenuation mismatch may be produced between the transistors M1 and M2 and between the transistors M3 and M4. Accordingly, the characteristic of the operation amplifier may be changed after the reliability test is performed thereon.

FIG. 2 illustrates the waveforms of the input signal VI and the output signal VO. Referring to FIG. 2, the input signal. VI may be an ideal square wave, and the rising edge and falling edge thereof are steep (almost vertical). The rising edge and falling edge of the output signal VO are delayed (for an ideal fixed value) according to the characteristics of the transistors. However, the amplification of the operation amplifier may be changed if attenuation mismatch between the transistors is produced after a reliability test of the same electrical characteristic is performed.

In other words, the problem of attenuation mismatch is produced due to different electrical characteristics and layout surroundings of symmetric devices in an operation amplifier when a reliability test is performed on the operation amplifier.

SUMMARY OF THE INVENTION

The present invention is directed to a circuit structure free from test effect and a testing method, wherein the problem of attenuation mismatch is resolved.

The present invention provides a circuit structure free from test effect. The circuit structure includes a first test terminal and a second test terminal. A symmetric circuit unit is coupled between the first test terminal and the second test terminal. The symmetric circuit unit includes a plurality of transistors, wherein the transistors are symmetrically disposed to form a first part circuit and a second part circuit. A switch control unit alternately connects the transistors of the first part circuit and the transistors of the second part circuit between the first test terminal and the second test terminal according to a control signal.

According to an embodiment of the present invention, in the circuit structure free from test effect, the symmetric circuit unit may be a differential circuit.

According to an embodiment of the present invention, in the circuit structure free from test effect, the differential circuit may include a current source and four transistors. The first transistor has a gate, a first connector, and a second connector, wherein the gate is coupled to one of the first test terminal and the second test terminal through the switch control unit, and the second connector is connected to the current source. The second transistor has a gate, a first connector, and a second connector, wherein the gate is coupled to the other one of the first test terminal and the second test terminal through the switch control unit, and the second connector is connected to the current source. The third transistor has a gate, a first connector, and a second connector, wherein the first connector is connected to a potential, the second connector is connected to the first connector of the first transistor, the gate is connected to the first connector of one of the first transistor and the second transistor through the switch control unit, and the third transistor is connected with the first transistor in series to form the first part circuit. The fourth transistor has a gate, a first connector, and a second connector, wherein the first connector is connected to the potential, the second connector is connected to the first connector of the second transistor, the gate is connected to the first connector of the other one of the first transistor and the second transistor through the switch control unit, and the fourth transistor is connected with the second transistor in series to form the second part circuit. The first connectors of the first transistor and the second transistor are coupled to the second test terminal through the switch control unit.

According to an embodiment of the present invention, in the circuit structure free from test effect, the gates of the third transistor and the fourth transistor may be coupled to each other.

According to an embodiment of the present invention, in the circuit structure free from test effect, the switch control unit may include four switches. The first switch is connected to the gate of the first transistor and alternatively connected to one of the first test terminal and the second test terminal. The second switch is connected to the gate of the second transistor and alternatively connected to the other one of the first test terminal and the second test terminal. The third switch is connected to the gates and the first connectors of the third transistor and the fourth transistor. The fourth switch couples the first connectors of the first transistor and the second transistor to the second test terminal.

According to an embodiment of the present invention, the circuit structure free from test effect may be an operation amplifier circuit, and the circuit structure further includes a first resistor connected to a ground voltage and an internal input terminal and a second resistor connected between the internal input terminal and the second test terminal.

According to an embodiment of the present invention, in the circuit structure free from test effect, the symmetric circuit unit of the operation amplifier circuit may include a current source and four transistors. The first transistor has a gate, a first connector, and a second connector, wherein the gate is coupled to one of the first test terminal and the internal input end through the switch control unit, and the second connector is connected to the current source. The second transistor has a gate, a first connector, and a second connector, wherein the gate is coupled to the other one of the first test terminal and the internal input end through the switch control unit, and the second connector is connected to the current source. The third transistor has a gate, a first connector, and a second connector, wherein the first connector is connected to a potential, the second connector is connected to the first connector of the first transistor, the gate is connected to the first connector of one of the first transistor and the second transistor through the switch control unit, and the third transistor is connected with the first transistor in series to form the first part circuit. The fourth transistor has a gate, a first connector, and a second connector, wherein the first connector is connected to the potential, the second connector is connected to the first connector of the second transistor, the gate is connected to the first connector of the other one of the first transistor and the second transistor through the switch control unit, and the fourth transistor is connected with the second transistor in series to foam the second part circuit. The first connectors of the first transistor and the second transistor are coupled to the second test terminal through the switch control unit.

According to an embodiment of the present invention, in the circuit structure free from test effect, the gates of the third transistor and the fourth transistor may be connected to each other.

According to an embodiment of the present invention, in the circuit structure free from test effect, the switch control unit may include four switches. The first switch is connected to the gate of the first transistor and alternatively connected to one of the first test terminal and the internal input end. The second switch is connected to the gate of the second transistor and alternatively connected to the other one of the first test terminal and the internal input end. The third switch is connected to the gates and the first connectors of the third transistor and the fourth transistor. The fourth switch couples the first connectors of the first transistor and the second transistor to the second test terminal.

The present invention provides a testing method of a symmetric device circuit structure, wherein the circuit structure includes a plurality of pairs of symmetrically disposed transistors, and a reliability test is performed on the circuit structure through a first test terminal and a second test terminal. The testing method includes following steps. The transistors are switched to a first connection state. A first testing operation is performed for totally a first time period in the first connection state. The transistors are switched to a second connection state, wherein each pair of transistors is switched between the first connection state and the second connection state. A second testing operation is performed for totally a second time period in the second connection state, wherein the first time period is substantially equal to the second time period.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
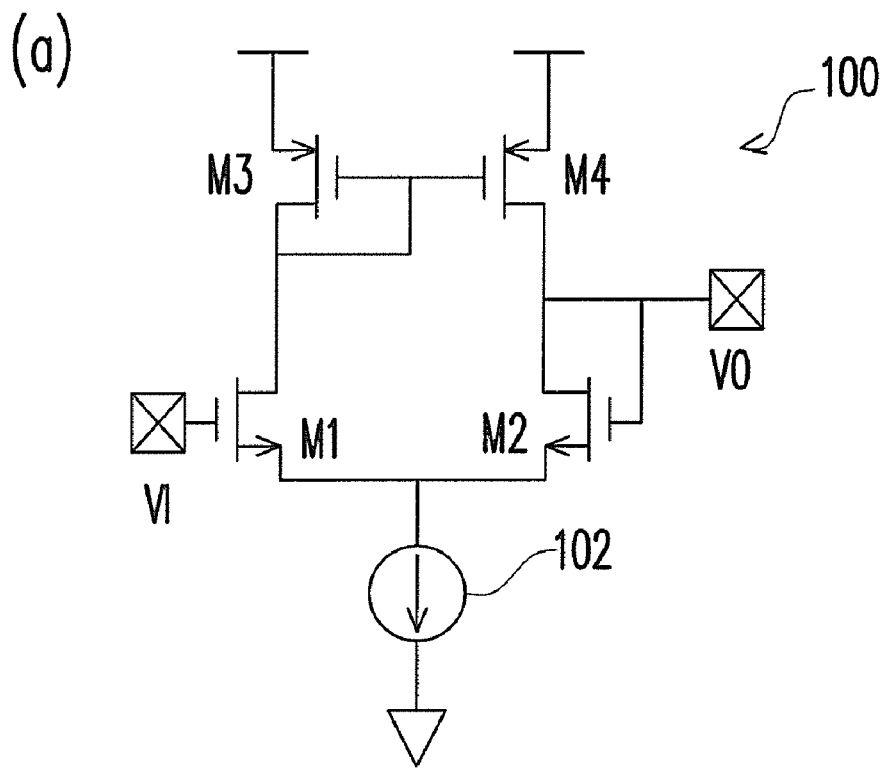
FIG. 1 is a diagram of an amplifier circuit in a conventional operation amplifier.
Figure 1:
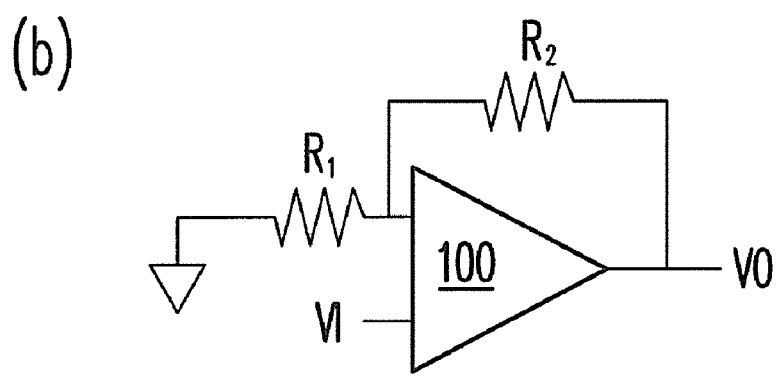
Figure 2:
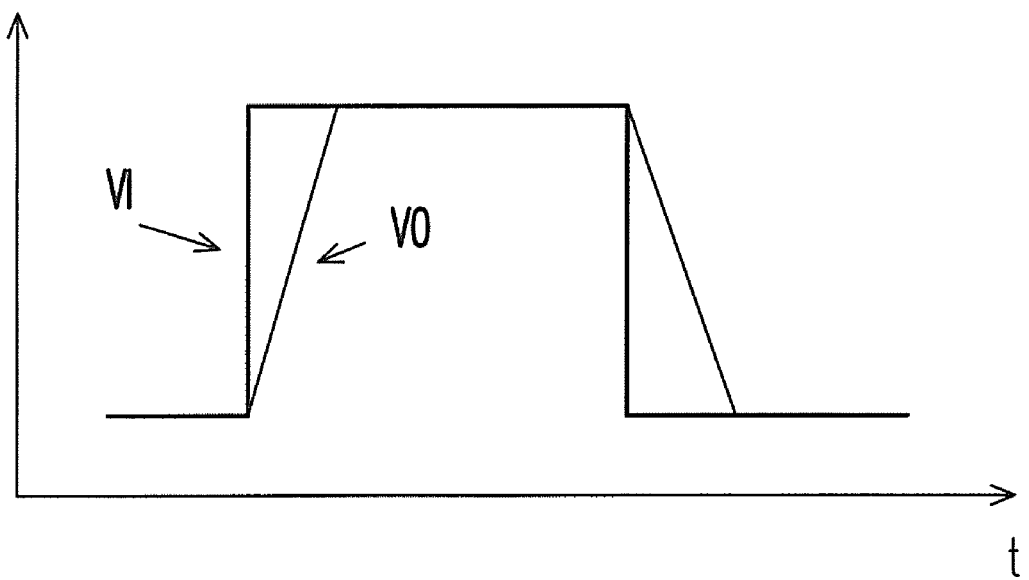
FIG. 2 illustrates the waveforms of an input signal VI and an output signal VO.

Reference will now be made in detail to the present preferred embodiments of the invention, examples of which are illustrated in the accompanying drawings. Wherever possible, the same reference numbers are used in the drawings and the description to refer to the same or like parts.

The present invention provides a concept that symmetric devices are allowed to have the same electrical characteristic and layout surroundings during a reliability test. Embodiments of the present invention will be described below. However, these embodiments are not intended to limit the present invention, and which can be combined to achieve other variations.

Figure 3:
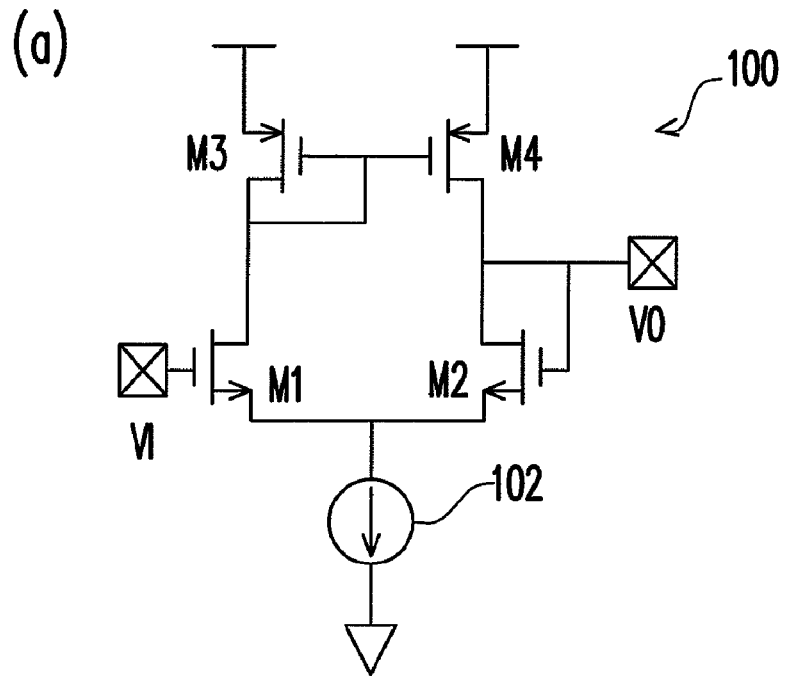
FIG. 3 is a diagram of a symmetric circuit that can be switched between two states according to an embodiment of the present invention.
Figure 3:
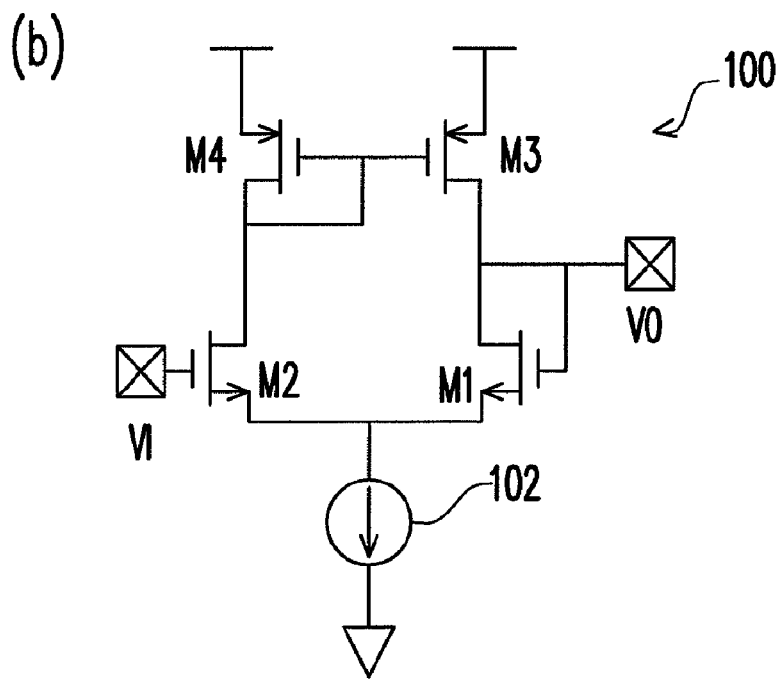

FIG. 3 is a diagram of a symmetric circuit that can be switched between two states according to an embodiment of the present invention. Referring to FIG. 3(a), the symmetric circuit of an operation amplifier is taken as an example, and which has a similar circuit as that illustrated in FIG. 1. For the convenience of description, the circuit in FIG. 3(a) is referred to as an A type circuit. Because the transistors of the symmetric circuit unit 100 illustrated in FIG. 3(a) are symmetrically disposed, these transistors remain substantially symmetrical even though the connections thereof are not completely symmetrical. Hence, the symmetrical transistors among the transistors M1~M4 of the symmetric circuit unit 100 can be switched through a switchable connection mechanism. The circuit illustrated in FIG. 3(b) is referred to as a B type circuit. In the present embodiment, the B type circuit is symmetrical to the A type circuit, wherein the transistors M1 and M2 can be switched, and the transistors M3 and M4 can be switched.

The operation voltage of the transistors M1 and M2 in the A type circuit during the reliability test is switched with the operation voltage of the transistors M1 and M2 in the B type circuit during the same reliability test. Thus, the attenuation of the transistor M1 is about the same as that of the transistor M2 if the total time spent on testing the A type circuit is about the same as the total time spent on testing the B type circuit during the entire reliability test. This also applies to the transistor M3 and the transistor M4.

Figure 4:
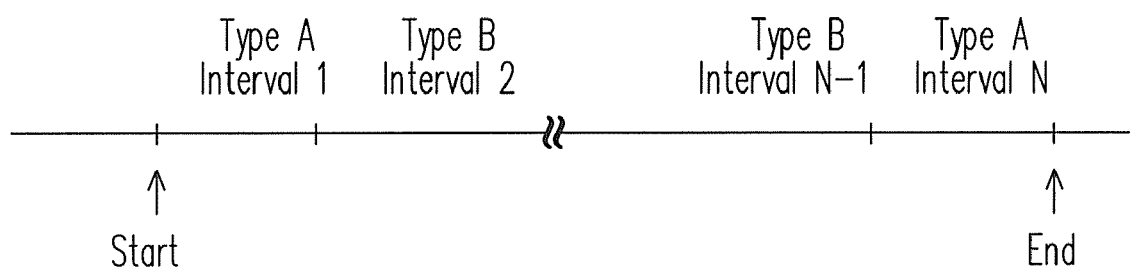
FIG. 4 illustrates the time division of a reliability test performed on the symmetric circuit in FIG. 3 according to an embodiment of the present invention.

FIG. 4 illustrates the time division of a reliability test performed on the symmetric circuit in FIG. 3 according to an embodiment of the present invention. Referring to FIG. 4, the total testing time (from start to end) on the time axis can be divided into N intervals. The A type circuit and the B type circuit may be alternatively tested during the N intervals, wherein each of the intervals may not have the same length. However, the total time spent on testing the A type circuit should be substantially the same as the total time spent on testing the B type circuit so that each of the two pairs of transistors formed by the transistors M1~M4 has about the same attenuation. Thus, the characteristic of the symmetric circuit can be maintained and the problem of attenuation mismatch can be resolved.

According to the present invention, a switch control unit may be adopted for switching the A type circuit and the B type circuit, wherein the switch control unit mainly switches the transistors. The switch control unit can be easily achieved in the symmetric circuit without establishing any complicated connection. Below, the implementation of the switch control unit will be described with reference to embodiments of the present invention.

Figure 5:
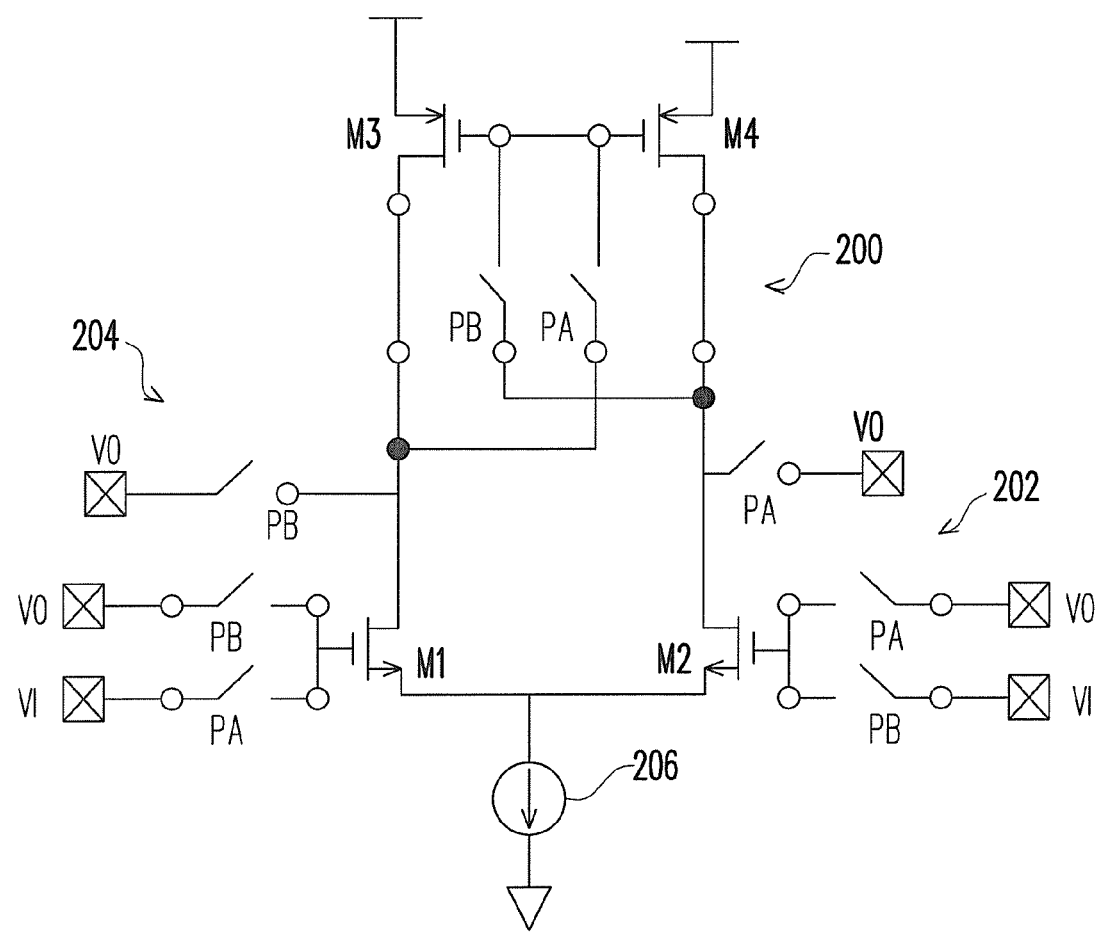
FIG. 5 is a circuit diagram of a differential circuit with switches according to an embodiment of the present embodiment.

FIG. 5 is a circuit diagram of a differential circuit with switches according to an embodiment of the present embodiment. Referring to FIG. 5, a switch control unit is disposed in the circuit illustrated in FIG. 3 for switching the transistors. The switch control unit may include three switch units 200, 202, and 204, wherein each of the switch units has a plurality of switch states corresponding to control signals PA and PB. In other words, two switchable circuits can be achieved by switching the four transistors M1~M4 through the switch units, wherein, for example, the transistors M1 and M2 are respectively switched by two switch units, and the transistors M3 and M4 are connected across each other so that they are switched by the switch unit 200. The switch control unit may be a MOS device, and which switches the transistors according to two control signals PA and PB. When a switch controlled by the control signal PA is turned on according to the control signal PA, a switch controlled by the control signal PB is turned off according to the control signal PB. Contrarily, when the switch controlled by the control signal PA is turned off according to the control signal PA, the switch controlled by the control signal PB is turned on according to the control signal PB.

The switch unit 200 switches the transistors M3 and M4. Because the gates of the transistors M3 and M4 are only connected to one of the transistors M1 and M2, the disposition of the switch unit 200 is slightly different from the dispositions of the switch units 202 and 204 corresponding to the transistors M3 and M4. However, the switch unit 200 is still used for switching transistors. The transistors M3 and M4 are switched according to the control signals PA and PB. Similarly, the gate of the transistor M2 is also connected to the switch unit 202 and alternatively connected to one of the input terminal VI and the output terminal VO. The gate of the transistor M1 is also connected to the switch unit 204 and alternatively connected to the other one of the input terminal VI and the output terminal VO. Accordingly, the A type circuit and the B type circuit are switched through the switch control unit.

A differential circuit is taken as an example of the symmetric circuit illustrated in FIG. 5. However, the technique provided by the present invention can also be applied to other symmetric circuits, and the present invention is not limited to the design of four transistors. In addition, the design of the switch control unit is not limited to the example described above.

Figure 6:
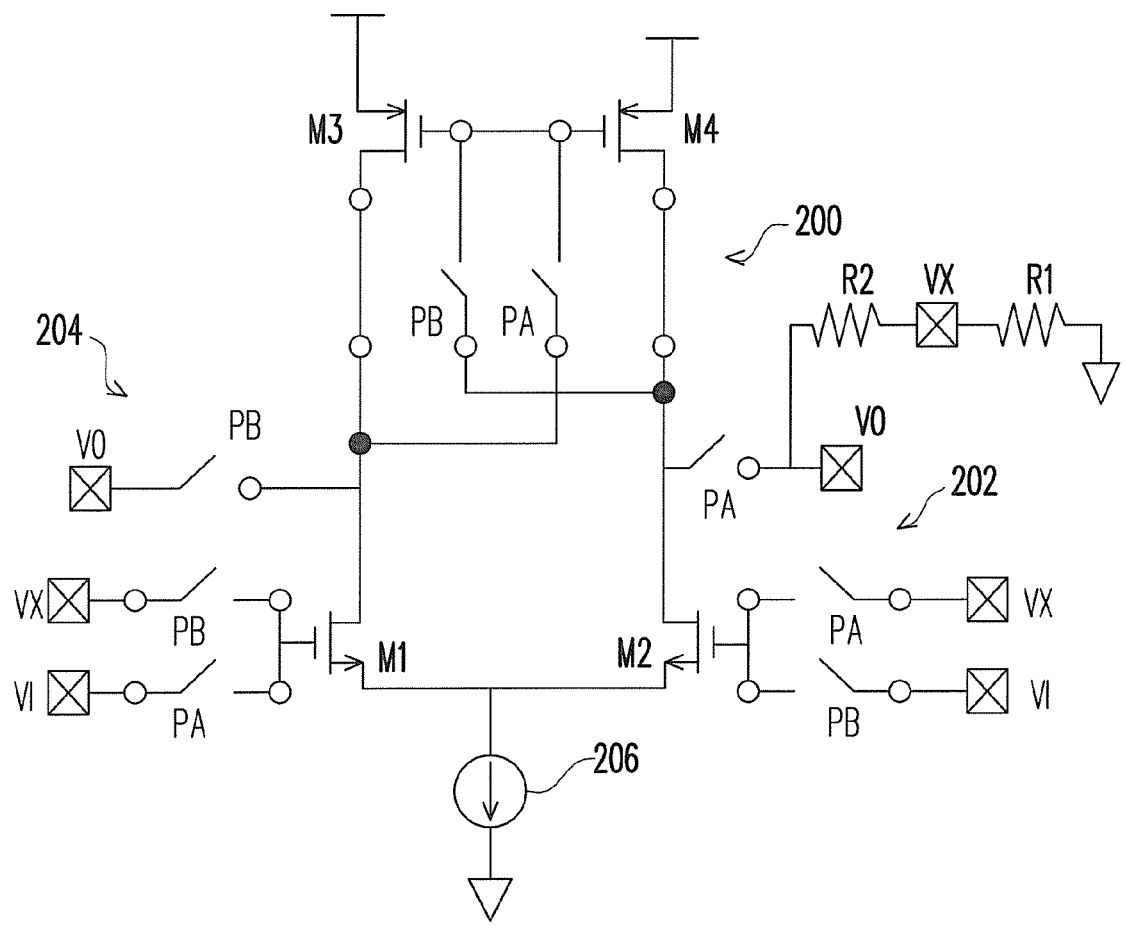
FIG. 6 is a circuit diagram of an operation amplifier circuit with switches according to an embodiment of the present embodiment.

Below, the application of an operation amplifier will be further described. FIG. 6 is a circuit diagram of an operation amplifier with switches according to an embodiment of the present embodiment. Referring to FIG. 6, an operation amplifier circuit is taken as an example so that the circuit needs to be connected to external resistors R1 and R2. Besides the input terminal VI, the operation amplifier circuit also has an internal input terminal VX for connecting the resistors R1 and R2, so as to achieve the amplification effect. Thus, the gates of the transistors M1 and M2 are connected to one of the input terminal VI and the internal input terminal VX through the switch units 202 and 204. As described above, the switch unit 200 switches the transistors M3 and M4. Thus, the A type circuit of the operation amplifier is tested when the control signal PA is enabled and the control signal PB is disabled. On the other hand, the B type circuit of the operation amplifier is tested when the control signal PA is disabled and the control signal PB is enabled.

The switch control technique described above is only an embodiment, and which may have other control and connection patterns according to different transistor switching requirements.

In actual operations, the problem of attenuation mismatch may also be resolved by switching the transistors according to the operation time.

The circuit structure and concept provided by the present invention can be applied to any symmetric devices.

The present invention provides a switch control device that selectively controls how a reliability test is performed on a circuit, so as resolve the attenuation mismatch problem. According to the present invention, the problem of attenuation mismatch can be resolved as long as the total time spent on testing a part of the circuit is the same or similar to the total time spent on testing another part of the circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit structure as an operation amplifier circyit, free from test effect, comprising:
    a first test terminal and a second test terminal;
    a symmetric circuit unit, coupled between the first test terminal and the second test terminal, comprising a plurality of transistors, wherein the transistors are symmetrically disposed to form a first part circuit and a second part circuit;
    a switch control unit, for alternatively connecting the transistors of the first part circuit and the transistors of the second part circuit between the first test terminal and the second test terminal according to a control signal;
    a first resistor, connected to a ground voltage and an internal input terminal; and
    a second resistor, connected between the internal input terminal and the second test terminal.

2. The circuit structure according to claim 1, wherein the symmetric circuit unit is a differential circuit.

3. The circuit structure according to claim 2, wherein the differential circuit comprises:
- a current source;
- a first transistor, having a gate, a first connector, and a second connector, wherein the gate is coupled to one of the first test terminal and the second test terminal through the switch control unit, and the second connector is connected to the current source;
- a second transistor, having a gate, a first connector, and a second connector, wherein the gate is coupled to another one of the first test terminal and the second test terminal through the switch control unit, and the second connector is connected to the current source;
- a third transistor, having a gate, a first connector, and a second connector, wherein the first connector is connected to a potential, the second connector is connected to the first connector of the first transistor, the gate is connected to the first connector of one of the first transistor and the second transistor through the switch control unit, and the third transistor is connected with the first transistor in series to form the first part circuit; and
- a fourth transistor, having a gate, a first connector, and a second connector, wherein the first connector is connected to the potential, the second connector is connected to the first connector of the second transistor, the gate is connected to the first connector of another one of the first transistor and the second transistor through the switch control unit, and the fourth transistor is connected with the second transistor in series to form the second part circuit,
- wherein the first connectors of the first transistor and the second transistor are coupled to the second test terminal through the switch control unit.

4. The circuit structure according to claim 3, wherein the gates of the third transistor and the fourth transistor are connected to each other.

5. The circuit structure according to claim 3, wherein the switch control unit comprises:
- a first switch, connected to the gate of the first transistor, alternatively connected to one of the first test terminal and the second test terminal;
- a second switch, connected to the gate of the second transistor, alternatively connected to another one of the first test terminal and the second test terminal;
- a third switch, connected to the gates and the first connectors of the third transistor and the fourth transistor; and
- a fourth switch, for coupling the first connectors of the first transistor and the second transistor to the second test terminal.

6. The circuit structure according to claim 3, wherein the first transistor and the second transistor are conductive transistors of a same type, and the third transistor and the fourth transistor are also conductive transistors of a same type but different from the first transistor and the second transistor.

7. The circuit structure according to claim 1, wherein the symmetric circuit unit comprises:
- a current source;
- a first transistor, having a gate, a first connector, and a second connector, wherein the gate is coupled to one of the first test terminal and the internal input terminal through the switch control unit, and the second connector is connected to the current source;
- a second transistor, having a gate, a first connector, and a second connector, wherein the gate is coupled to another one of the first test terminal and the internal input terminal through the switch control unit, and the second connector is connected to the current source;
- a third transistor, having a gate, a first connector, and a second connector, wherein the first connector is connected to a potential, the second connector is connected to the first connector of the first transistor, the gate is connected to the first connector of one of the first transistor and the second transistor through the switch control unit, and the third transistor is connected with the first transistor in series to form the first part circuit; and
- a fourth transistor, having a gate, a first connector, and a second connector, wherein the first connector is connected to the potential, the second connector is connected to the first connector of the second transistor, the gate is connected to the first connector of another one of the first transistor and the second transistor through the switch control unit, and the fourth transistor is connected with the second transistor in series to form the second part circuit,
- wherein the first connectors of the first transistor and the second transistor are coupled to the second test terminal through the switch control unit.

8. The circuit structure according to claim 7, wherein the gates of the third transistor and the fourth transistor are connected to each other.

9. The circuit structure according to claim 7, wherein the switch control unit comprises:
- a first switch, connected to the gate of the first transistor, alternatively connected to one of the first test terminal and the internal input terminal;
- a second switch, connected to the gate of the second transistor, alternatively connected to another one of the first test terminal and the internal input terminal;
- a third switch, connected to the gates and the first connectors of the third transistor and the fourth transistor; and
- a fourth switch, for coupling the first connectors of the first transistor and the second transistor to the second test terminal.

10. The circuit structure according to claim 7, wherein the first transistor and the second transistor are conductive transistors of a same type, and the third transistor and the fourth transistor are also conductive transistors of a same type but different from the first transistor and the second transistor.

11. A testing method of a symmetric device circuit structure, wherein the circuit structure comprises a plurality of pairs of symmetrically disposed transistors, and a reliability test is performed on the circuit structure through a first test terminal and a second test terminal, the testing method comprising:
- switching the transistors to a first connection state;
- performing a first testing operation for totally a first time period in the first connection state;
- switching the transistors to a second connection state, wherein each of the pairs of transistors are switched between the first connection state and the second connection state; and
- performing a second testing operation for totally a second time period in the second connection state, wherein the first time period is substantially equal to the second time period.

12. The testing method according to claim 11, wherein the circuit structure is a differential circuit.

13. The testing method according to claim 11, wherein the circuit structure is an operation amplifier circuit.

14. The testing method according to claim 11, wherein the first time period is divided to a plurality of intervals.

15. The testing method according to claim 11, wherein the second time period is divided to a plurality of intervals.

16. The testing method according to claim 11, wherein the first time period is divided to a plurality of segments, the second time period is divided to a plurality of segments, and the reliability test is performed with the first time period and the second time period mixed with each other.

* * * * *